US 6,690,237 B2

(12) United States Patent
Miyazawa (10) Patent No.: US 6,690,237 B2
(45) Date of Patent: Feb. 10, 2004

(54) HIGH FREQUENCY POWER AMPLIFIER, AND COMMUNICATION APPARATUS (75) Inventor: Naoyuki Miyazawa, Nakakoma (JP)

(73) Assignee: Fujitsu Quantum Devices Limited, Yamanashi (JP)

( * ) Notice: Subject to any disclaimer, the term of this patent is extended or adjusted under 35 U.S.C. 154(b) by 49 days.

(21) Appl. No.: 09/802,132

(22) Filed: Mar. 9, 2001

(65) Prior Publication Data
US 2001/0020872 A1 Sep. 13, 2001

(30) Foreign Application Priority Data
Mar. 13, 2000 (JP) ........................................ 2000-068537

(51) Int. Cl.[7] ................................................ H03G 3/10
(52) U.S. Cl. ........................ 330/285; 330/290; 330/296
(58) Field of Search ................................ 330/285, 290, 330/296, 298, 133

(56) References Cited

U.S. PATENT DOCUMENTS

| 4,709,404 | A | * | 11/1987 | Tamura et al. | ............... | 455/126 |
| 5,543,760 | A | * | 8/1996 | Honda et al. | ............... | 330/298 |
| 6,043,714 | A | * | 3/2000 | Yamamoto et al. | ......... | 330/296 |
| 6,081,161 | A | * | 6/2000 | Dacus et al. | ............... | 330/297 |
| 6,137,366 | A | * | 10/2000 | King | ...................... | 330/207 P |
| 6,148,220 | A | * | 11/2000 | Sharp et al. | ................ | 455/572 |
| 6,304,145 | B1 | * | 10/2001 | Laureanti et al. | ........... | 330/132 |
| 6,396,350 | B2 | * | 5/2002 | Nam | .......................... | 330/297 |
| 6,404,287 | B2 | * | 6/2002 | Dening et al. | .............. | 330/296 |
| 6,430,402 | B1 | * | 8/2002 | Agahi-Kesheh | .......... | 455/115.3 |

FOREIGN PATENT DOCUMENTS

| JP | Hei 2-206904 A | 8/1990 |
| JP | 7-250017 | 9/1995 |
| JP | Hei 8-51317 A | 2/1996 |
| JP | Hei 8-31750 B | 3/1996 |
| JP | 11-163640 | 6/1999 |
| JP | 11-220337 | 8/1999 |

* cited by examiner

Primary Examiner—Michael Tokar
Assistant Examiner—Khai M. Nguyen
(74) Attorney, Agent, or Firm—Westerman, Hattori, Daniels & Adrian, LLP

(57) ABSTRACT

The high frequency power amplifier comprises a detector which detects a collector output power (or base input power) of an amplifying transistor, and a DC/DC converter which changes a collector voltage of the amplifying transistor in proportion to the detected power. Thus, a DC power consumed by the amplifying transistor is controlled. A resistor for a base bias of the amplifying transistor is connected to the DC/DC converter, thereby interlocking the base bias control with the control of the DC/DC converter.

16 Claims, 12 Drawing Sheets

HIGH FREQUENCY POWER AMPLIFIER, AND COMMUNICATION APPARATUS

FIELD OF THE INVENTION

The present invention in general relates to a high frequency power amplifier using a heterojunction bipolar transistor (hereinbelow, called an HBT) made of InGaP/GaAs or the like and a communication apparatus using the high frequency power amplifier. More particularly, this invention relates to a high frequency power amplifier used in the case of performing an output power control, typified by a CDMA (Code Division Multiple Access) system or the like.

BACKGROUND OF THE INVENTION

Recently, a high frequency amplifier for use in a portable telephone or the like is required to have higher efficiency to satisfy both small size and light weight of a battery and a longer speech communication time. Particularly, in a high frequency amplifier for a digital radio communication system, in order to reduce power consumption, an RF output power is controlled as necessary. Consequently, high efficiency and high linearity are requested over a wide range of an RF input power.

Figure 1:
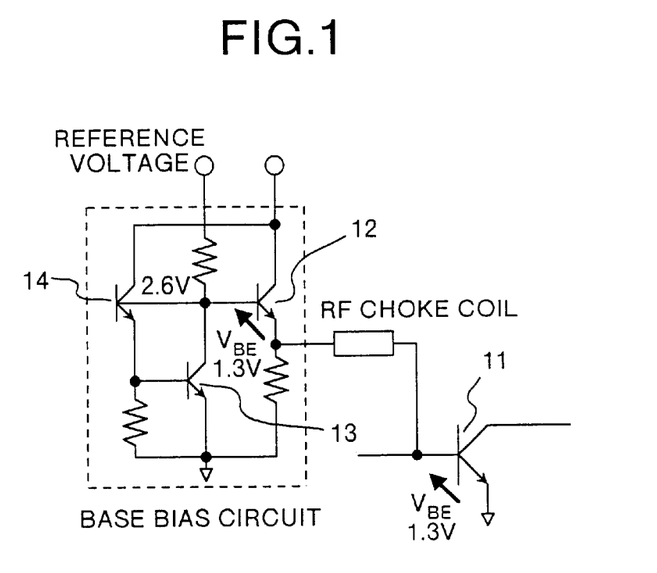
FIG. 1 is a circuit diagram showing a conventional high frequency power amplifier using a constant voltage source bias circuit of an emitter follower transistor type.

FIG. 1 is a circuit diagram showing a conventional high frequency power amplifier using an emitter follower transistor type constant voltage source bias circuit. As shown in FIG. 1, in a high frequency amplifier using a bipolar transistor, an emitter follower transistor 12 is used as a voltage source for supplying a base current to an amplifying transistor 11. In the circuit, in order to cancel out a temperature change in a voltage Vbe between the base and emitter of the amplifying transistor 11 and in a voltage Vbe between the base and emitter of the emitter follower transistor 12, transistors 13 and 14 at two stages are provided.

Each of the voltage Vbe between the base and emitter of the amplifying transistor 11 and the voltage Vbe between the base and emitter of the emitter follower transistor 12 is 1.3V. In the high frequency power amplifier having such a configuration, therefore, a reference voltage higher than 2.6V has to be supplied from the outside to a bias circuit.

Meanwhile, recently, a portable telephone system operated on a power supply voltage of about 3V by using a lithium ion battery, NiCd (nickel cadmium) battery, or the like is being realized. In such a system, the voltage of a control IC for outputting the reference voltage is becoming lower. It is, therefore, difficult to make the reference voltage higher than 2.6V.

Figure 2:
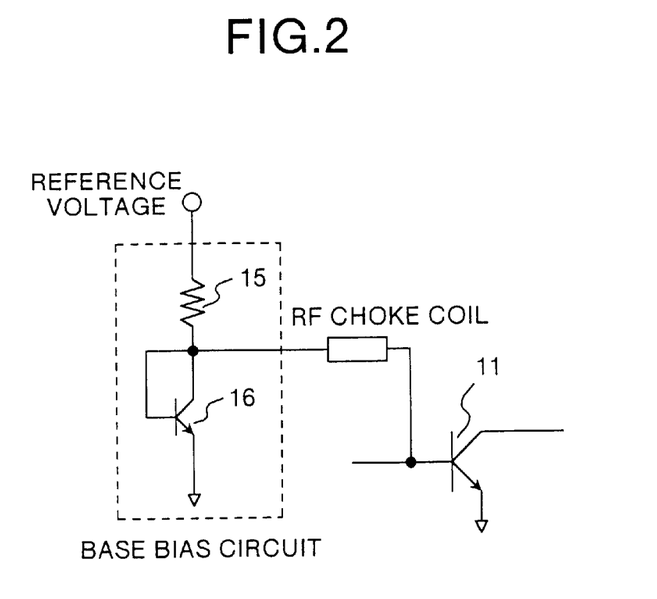
FIG. 2 is a circuit diagram showing the configuration of a high frequency power amplifier in the case of using a resistor for a base bias circuit.

Consequently, it is considered to apply a bias by using a resistor without using the emitter follower transistor. FIG. 2 is a circuit diagram showing the configuration of the high frequency power amplifier in the case where a resistor is used for a base bias circuit. In the high frequency power amplifier, a resistor 15 is connected to the base of the amplifying transistor 11. In the circuit, in order to cancel a temperature change in the voltage Vbe between the base and emitter of the amplifying transistor 11, a transistor 16 for temperature compensation is provided.

In the bias circuit shown in FIG. 2, however, a base bias current which flows via the resistor 15 changes in proportion to an RF output power of the amplifier. A base bias voltage therefore largely fluctuates and an operating point is not constant. Consequently, a problem such that an adjacent leakage power ratio deteriorates occurs.

In a state where the RF output power is low, the base bias current is reduced as compared with that at the time of a maximum RF output, so that a voltage drop amount of the resistor 15 decreases. It makes the base bias voltage rise, and the operation of the amplifier becomes Class A operation. A problem such that the efficiency deteriorates arises.

Further, the reference voltage output of the control IC is generally a CMOS output. Consequently, there is also a problem such that it is difficult for the control IC to supply the base bias current of 10 to 20 mA required by an amplifier of about 1W output.

SUMMARY OF THE INVENTION

It is an object of this invention to provide a high frequency power amplifier which can operate with high efficiency over a wide range of an RF output by changing a collector-bias voltage of an amplifying transistor and a communication apparatus using the high frequency power amplifier.

The frequency power amplifier according to one aspect of this invention comprises a detecting unit which detects a collector output power (or base input power) of an amplifying transistor, a voltage changing unit which changes a collector voltage of the amplifying transistor in proportion to the detected power. Furthermore, a resistor for a base bias of the amplifying transistor is connected to the voltage changing unit.

According to the above-mentioned aspect of this invention, the collector voltage of the amplifying transistor is changed in proportion to the RF output power and the DC power consumed by the amplifying transistor is consequently controlled, so that high efficiency can be obtained over a wide range of the RF output. Since the base bias control of the amplifying transistor can be performed interlockingly with the control of a collector voltage source of a large current capacity, a base bias control terminal becomes unnecessary.

Other objects and features of this invention will become apparent from the following description with reference to the accompanying drawings.

DESCRIPTION OF THE PREFERRED EMBODIMENTS

Preferred embodiments of the high frequency power amplifier and the communication apparatus according to this invention will be described in detail hereinbelow with reference to the attached drawings.

Figure 3:
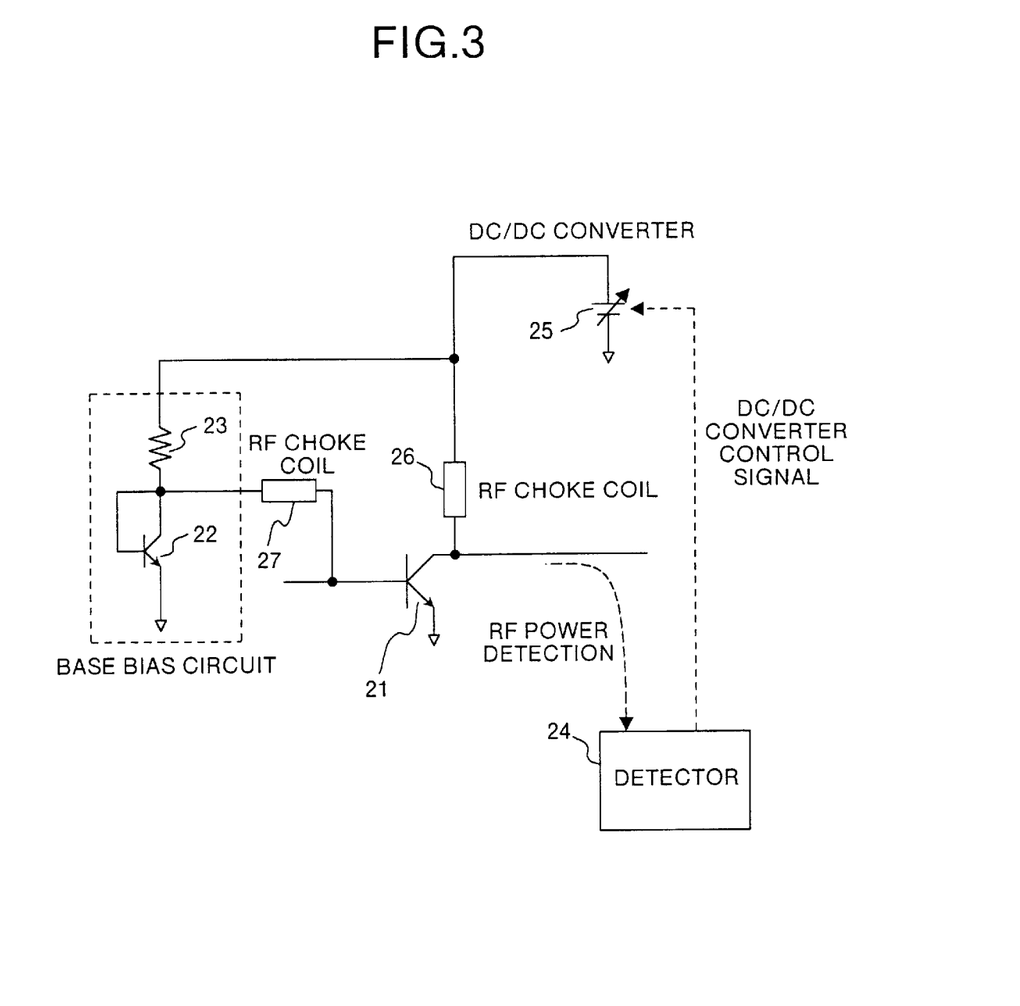
FIG. 3 is a circuit diagram showing the configuration of a high frequency power amplifier according to a first embodiment of the invention.

FIG. 3 is a circuit diagram showing the configuration of a high frequency power amplifier according to a first embodiment. The high frequency power amplifier has an amplifying transistor 21, a transistor 22 for temperature compensation, a resistor 23, a detector 24 as detecting unit which detects a collector output power of the amplifying transistor 21, and a DC/DC converter 25 as voltage changing unit which changes the collector voltage of the amplifying transistor 21. The high frequency power amplifier also has two RF choke coils 26 and 27.

Each of the amplifying transistor 21 and the transistor 22 for temperature compensation takes the form of an HBT. The emitter of the amplifying transistor 21 is connected to the ground side. The amplifying transistor 21 amplifies the power supplied to the base and outputs the amplified power to the collector. The emitter of the transistor 22 for temperature compensation is connected to the ground side. The base and collector of the transistor 22 for temperature compensation are commonly connected to one end of the choke coil 27. The other end of the choke coil 27 is connected to the base of the amplifying transistor 21.

The resistor 23 is a resistor for a base bias of the amplifying transistor 21. One end of the resistor 23 is connected to the collector (base) of the transistor 22 for temperature compensation. The other end of the resistor 23 is connected to the DC/DC converter 25. The DC/DC converter 25 is connected to the collector of the amplifying transistor 21 via the choke coil 26.

The detector 24 detects an RF output power and outputs a DC/DC converter control signal to the DC/DC converter 25. The DC/DC converter 25 receives the DC/DC converter control signal and changes the collector voltage of the amplifying transistor 21 in proportion to the RF output power.

For example, the amplifying transistor 21, transistor 22 for temperature compensation, resistor 23, and choke coils 26 and 27 are formed on the same semiconductor chip. The detector 24 and the DC/DC converter 25 are attached to the semiconductor chip externally.

Figure 4:
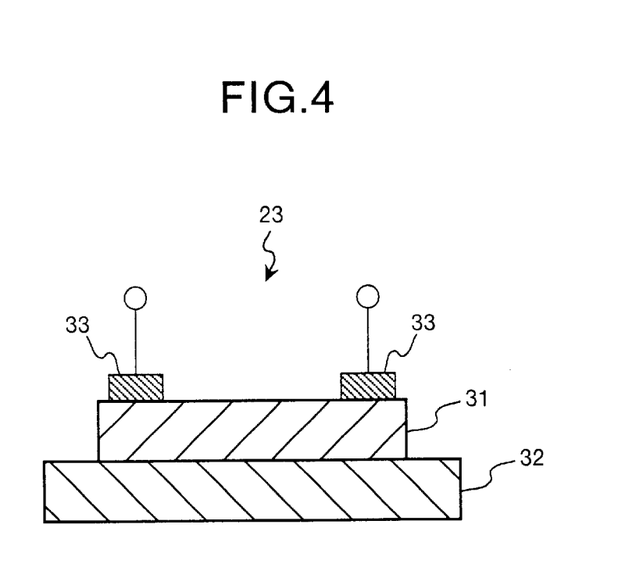
FIG. 4 is a cross section schematically showing an example of a resistor as a component of the high frequency power amplifier according to the first embodiment.
Figure 5:
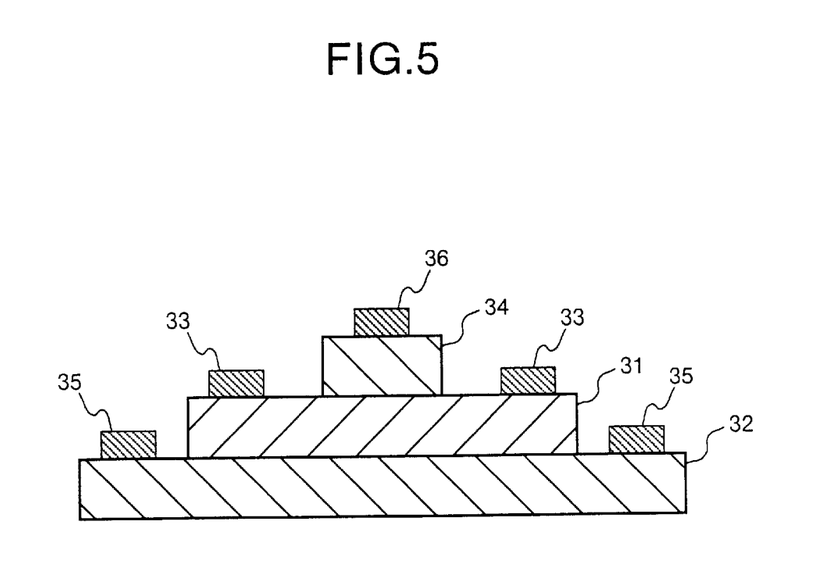
FIG. 5 is a cross section schematically showing the configuration of a heterojunction bipolar transistor.

FIG. 4 is a cross section schematically showing an example of the resistor 23. The resistor 23 is, although not particularly limited, formed by using a base layer 31 of an HBT for example. In this case, an effect such that manufacture variations in current amplification factor β of the transistor are cancelled is obtained. As a reference, the sectional structure of the HBT is shown in FIG. 5. Shown in FIGS. 4 and 5 are a collector layer 32, a base electrode 33, an emitter layer 34, a collector electrode 35, and an emitter electrode 36.

Generally, when a resistor is formed by using the base layer, the resistance value and the current amplification factor β depend on the impurity concentration of the base layer. When the base impurity concentration is low, the resistance value is large. When the base impurity concentration is low, the current amplification factor β increases, and a base current value decreases. Consequently, even when the current amplification value β increases due to manufacture variations and the base current decreases, the resistance value automatically increases, so that a voltage to be applied to the base is automatically corrected to be constant.

The action of the high frequency power amplifier shown in FIG. 3 will now be described by using specific numerical values. Assuming now that the collector voltage upper limit set value Vcmax when the maximum RF output is 1W is 3.5V, and a collector current Icmax at this time is 500 mA. Icmax is almost determined by the load side impedance of the transistor adjusted so that both the efficiency and the adjacent leakage power ratio become optimum. Vcmax is the maximum value which can be set from the power supply voltage of the system. The current amplification factor β of the amplifying transistor 21 is set to 100. A collector current Icq in a standby mode when there is no RF input is set to 100 mA. The size of the transistor 22 for temperature compensation is 1/100 of that of the amplifying transistor 21. A diode current Ibias is set to 1 mA which is 1/100 of Icq.

A resistance value R of the bias resistor 23 is determined as follows. In order to obtain a good adjacent leakage power ratio when the power output is the maximum, it is necessary to set the base bias voltage to the optimum value. It is assumed that the optimum base bias voltage is 1.3V. The current passing to the resistor 23 at this time is 1 mA of Ibias and 5 mA corresponding to 1/100 of Icmax 500 mA. The value R is therefore calculated as 367 Ω from the following equation.

$$3.5(V) - R(\Omega) \times [1(mA) + 5(mA)] = 1.3(V)$$

When the base bias voltage is set so as to be maintained at 1.3V, the collector voltage set value Vcmin in the standby mode and a low output power mode is calculated as 2.03V by the following equation.

$$Vcmin(V) - 367(\Omega) \times [1(mA) + 1(mA)] = 1.3(V)$$

Figure 6:
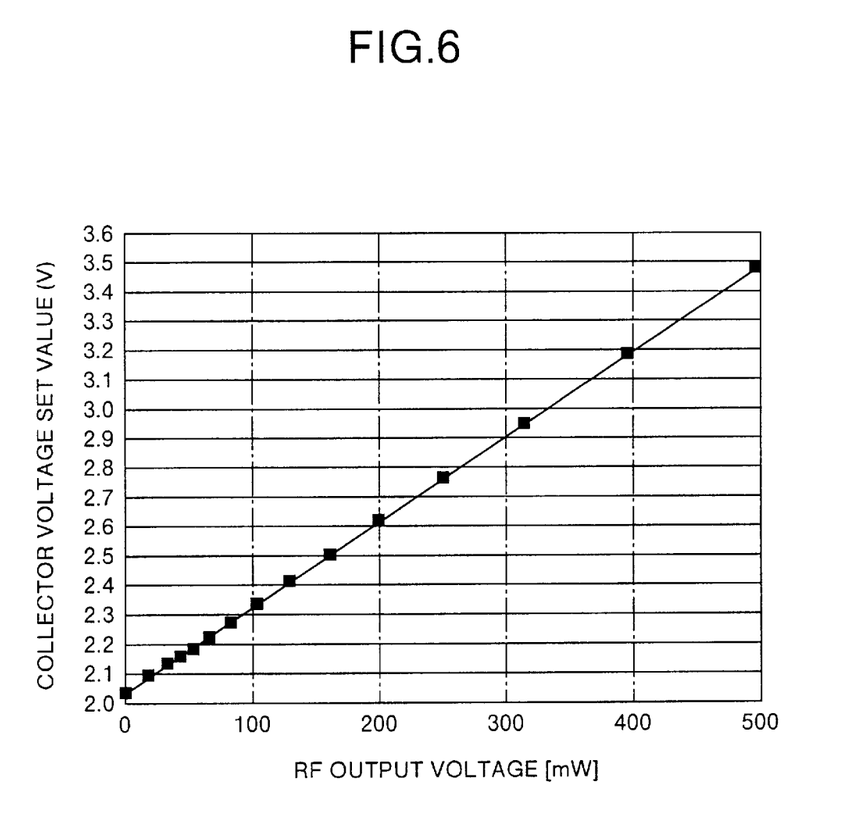
FIG. 6 is a collector voltage value change table with respect to an RF output power value in the high frequency power amplifier according to the first embodiment.

As shown in the collector voltage value change table with respect to the RF output power value in FIG. 6, therefore, by linearly changing the collector bias voltage of the amplifying transistor 21 from 2.03V to 3.5V in proportion to the output power, the base bias voltage can be maintained at 1.3V at which a good adjacent leakage power ratio can be obtained in a range from the minimum to the maximum of the RF output.

Figure 7:
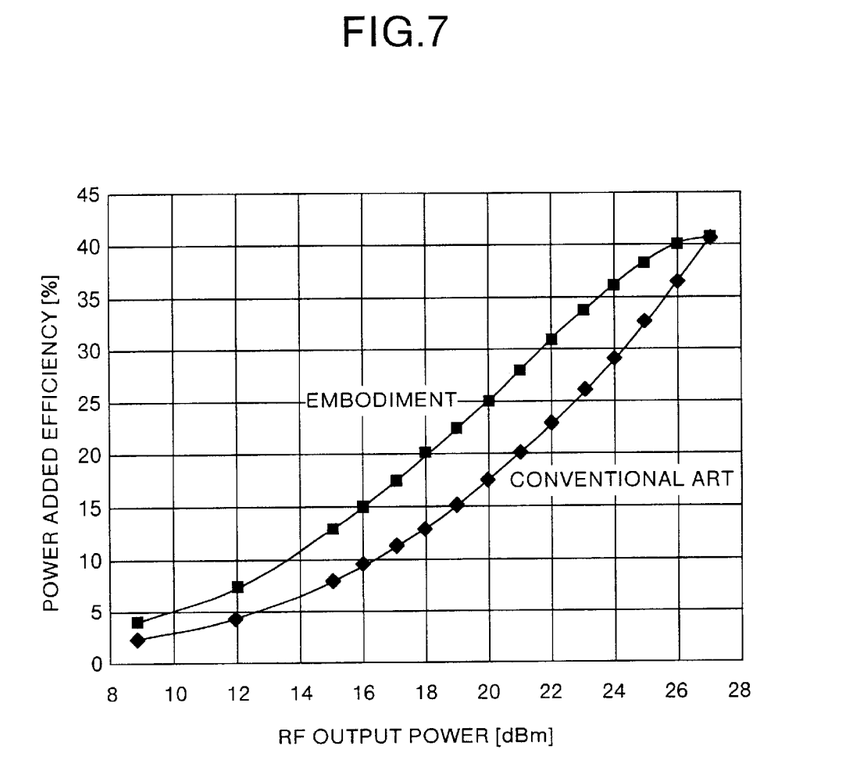
FIG. 7 is a graph showing the result of efficiency comparison between the high frequency power amplifier according to the first embodiment and a conventional high frequency power amplifier.
Figure 8:
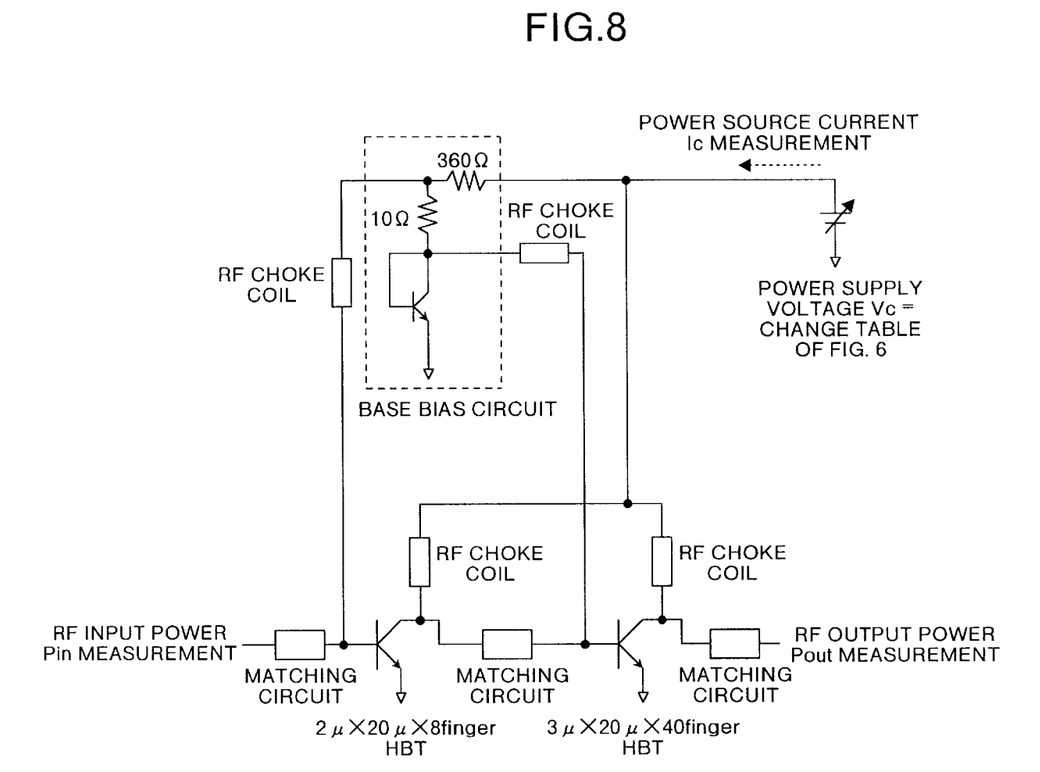
FIG. 8 is a diagram showing the configuration in a case where the efficiency of the high frequency power amplifier according to the first embodiment is measured.
Figure 9:
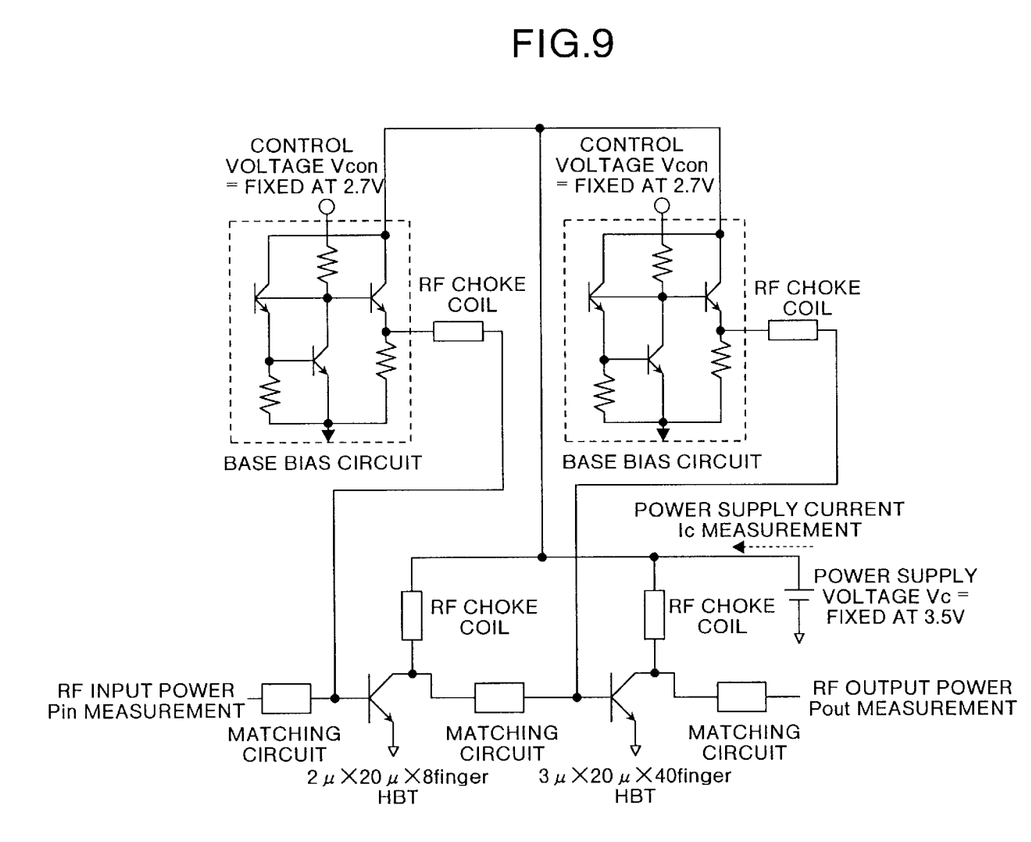
FIG. 9 is a diagram showing the configuration in a case where the efficiency of the conventional high frequency power amplifier is measured for a comparison.

FIG. 7 shows the result of the comparison of the efficiency between the high frequency power amplifier according to the first embodiment and the conventional high frequency power amplifier. FIGS. 8 and 9 show the configurations at the time of measuring the efficiency of the high frequency power amplifier according to the first embodiment and that of the conventional one. From FIG. 7, it is confirmed that the efficiency in the low output power mode is largely improved as compared with the conventional high frequency power amplifier.

In the case where the base bias voltage is further decreased to about 1.2V which is in the Class AB in order to further improve the efficiency at the time where the power lower than the maximum power is outputted, the value of Vcmin is derived as 1.93V from the following equation. By linearly changing the collector bias voltage of the amplifying transistor 21 from 1.93V to 3.5V in proportion to the output power, higher efficiency is obtained in the low output power mode.

$$Vcmin(V)-367(\Omega)\times[1(mA)+1(mA)]=1.2(V)$$

Further, depending on the use of the amplifier, there is a case such that the power gain flatness in a wide output range is more important than the high efficiency at the time of outputting a low power. Generally, when the amplifier is operated under bias conditions close to the Class B operation, as the output power increases, the power gain may increase. In the method of always maintaining the base bias voltage in the above example at 1.3V and the method of decreasing the voltage to 1.2V in the low output mode, the power gain in the low output power mode may decrease.

In such a case, by increasing the base bias voltage at the time of outputting a power lower than the maximum power to about 1.35V in a manner opposite to the above example, a drop in the power gain at the time of the low output can be corrected. Vcmin in this case is derived as 2.08V from the following equation. By changing the collector bias voltage of the amplifying transistor 21 from 2.08V to 3.5V in proportion to the output power, the power gain flatness in a wide output power range can be obtained.

$$Vcmin(V)-367(\Omega)\times[1(mA)+1(mA)]=1.35(V)$$

As described above, according to the first embodiment, high efficiency can be obtained in a wide range of the RF output. The resistor 23 for the base bias of the amplifying transistor 21 is connected to the DC/DC converter 25 for changing the collector voltage of the amplifying transistor 21, so that the base bias control can be performed interlockingly with the control of the collector voltage source of a large current capacity. Thus, the base bias control terminal becomes unnecessary.

This is an effect obtained by positively using a change of a voltage drop of the bias resistor 23 in association with a change in the base current proportional to the RF output power in the power amplifier using the HBT. That is, the effect such that the base bias control terminal is made unnecessary cannot be obtained by a general method of achieving high efficiency by decreasing the collector voltage while applying a constant base vias voltage and by a device such as an HEMT in which the gate bias current does not change in proportion to the RF output power.

Although the resistor 23 is constructed by using the base layer of the HBT in the first embodiment, the invention is not limited to the configuration but the resistor 23 or a part of the resistor 23 may be formed by a resistor for temperature compensation such as a thermistor. With such a configuration, a fluctuation at the time of a temperature change in the diode current Ibias of the transistor 22 for temperature compensation can be compensated.

The detector 24 detects the collector output power of the amplifying transistor 21 in the first embodiment. However, the invention is not limited to the above and the detector 24 may detect the base input power of the amplifying transistor 21.

Figure 10:
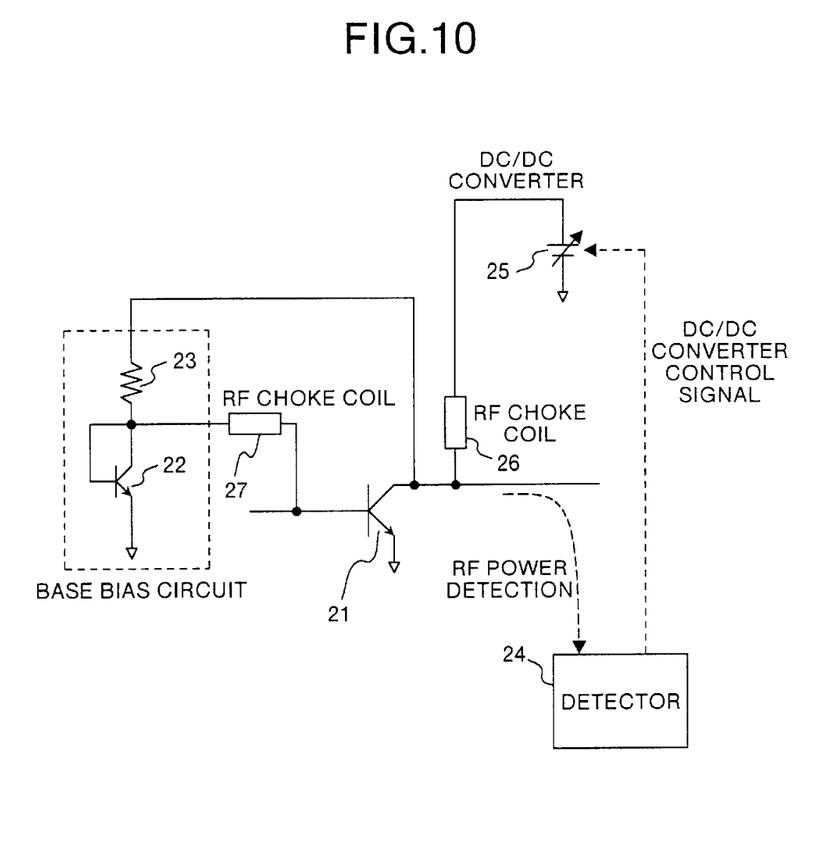
FIG. 10 is a circuit diagram showing another configuration of the high frequency power amplifier according to the first embodiment.

As shown in FIG. 10, the resistor 23 may be connected, not via the choke coil 26 for bias, directly to the collector of the amplifying transistor 21. With such a configuration, an operation similar to that of the amplifier shown in FIG. 3 can be performed. In addition, the resistor 23 acts as a low frequency negative feedback resistor, so that an effect of stabilization can be simultaneously obtained. Further, the resistor 23 and the collector of the amplifying transistor 21 can be connected via a chip internal line. Consequently, the number of terminals of the semiconductor chip can be decreased.

Figure 11:
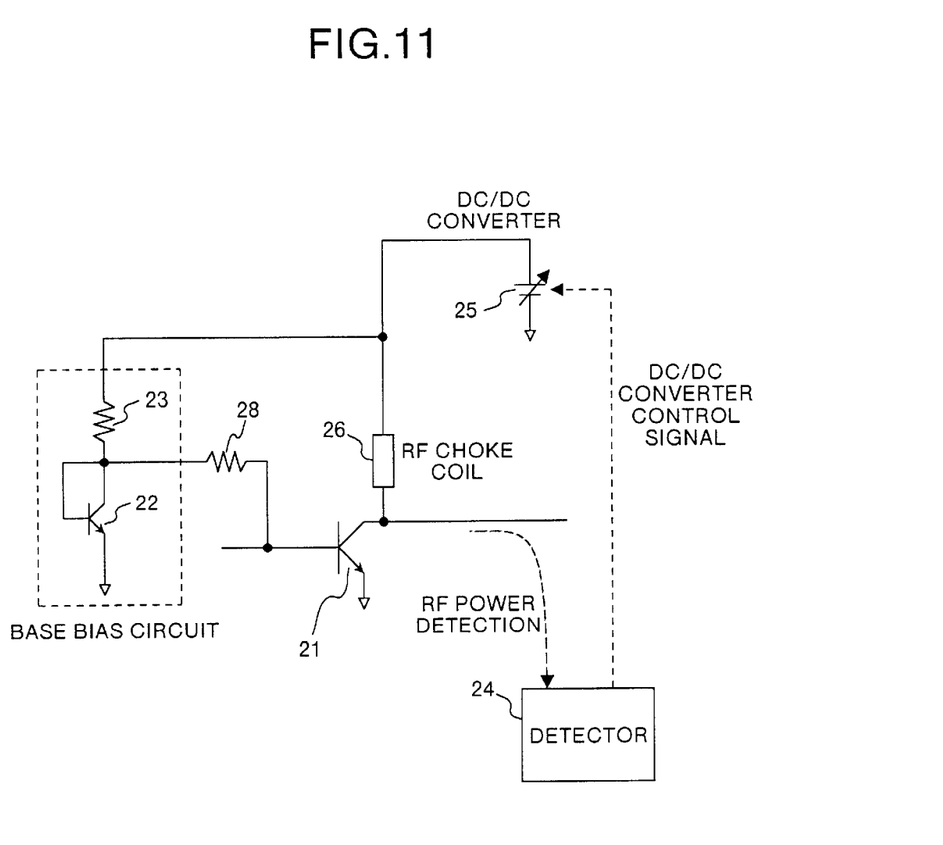
FIG. 11 is a circuit diagram showing further another configuration of the high frequency power amplifier according to the first embodiment.

As shown in FIG. 11, the base bias may be supplied by using the resistor 28 as a second resistor in place of the choke coil. In this case, when a part of 367 Ω of the base bias resistance value derived by the above-described calculation is used as the resistance 28, an operation substantially the same as that of the amplifier shown in FIG. 3 can be carried out. The size can be reduced more than the case where the choke coil is used.

Figure 12:
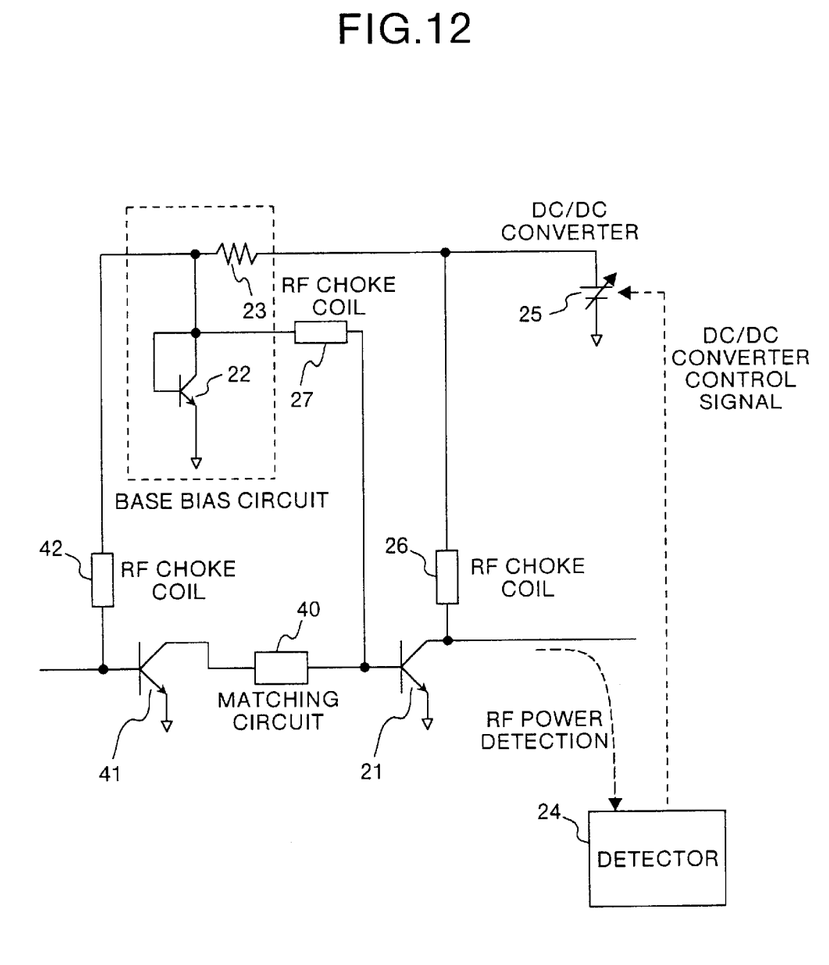
FIG. 12 is a circuit diagram showing the configuration of a high frequency power amplifier according to a second embodiment of the invention.

FIG. 12 is a circuit diagram showing the configuration of a high frequency power amplifier according to the second embodiment. In the high frequency power amplifier, an HBT 41 for amplification is connected at the front stage of the high frequency power amplifier of the first embodiment shown in FIG. 3 via a matching circuit 40. The base bias voltage of the amplifying transistor 41 at the front stage is supplied from the base bias circuit of the high frequency power amplifier of the first embodiment. That is, the base of the amplifying transistor 41 at the front stage is connected to the DC/DC converter 25 via an RF choke coil 42 and the resistor 23.

For example, the amplifying transistor 21, transistor 22 for temperature compensation, resistor 23, amplifying transistor 41 at the front stage, and the choke coils 26, 27, and 42 are formed on the same semiconductor chip. Since the other configuration is the same as that of the first embodiment, the components same as those of the first embodiment are designated by the same reference numerals and their description will not be repeated here.

According to the second embodiment, the high-efficiency amplifier of the two-stage configuration can be obtained in a wide range of the RF output. Since the base bias circuit for the amplifying transistor 41 at the front stage is made unnecessary, the circuit configuration is simplified and the small size can be achieved.

Figure 13:
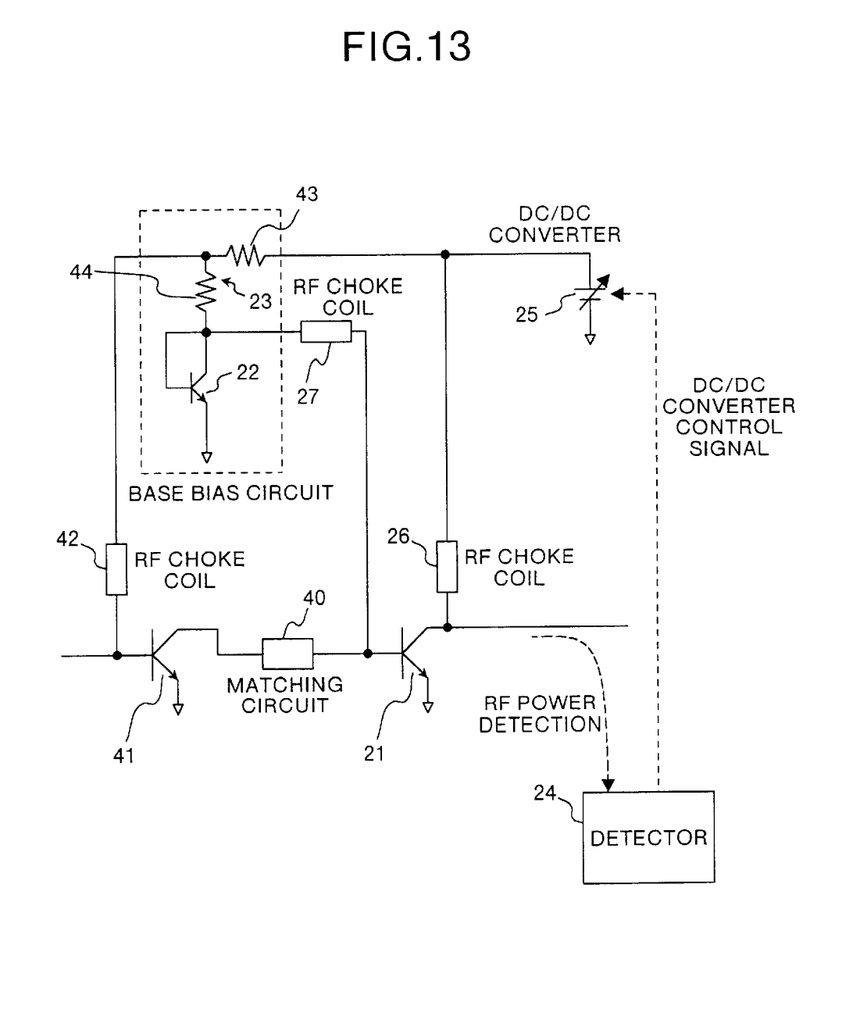
FIG. 13 is a circuit diagram showing another configuration of the high frequency power amplifier according to the second embodiment.

As shown in FIG. 13, the resistor 23 may be divided into resistors 43 and 44, and the base of the amplifying transistor 41 at the front stage may be connected to the division point between the resistors 43 and 44 via the choke coil 42. In such a manner, the bias point of the amplifying transistor 41 at the front stage can be set to be higher than that of the amplifying transistor 21 at the final stage. Thus, to obtain higher linearity, the amplifying transistor 41 at the front stage can be operated at an operating point close to the Class A operation.

Figure 14:
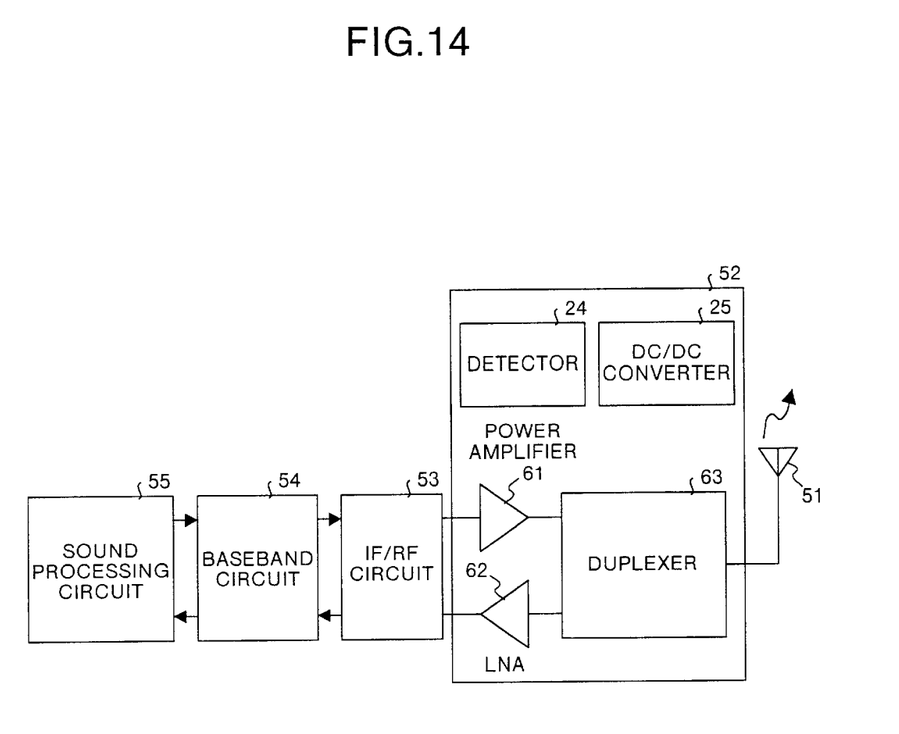
FIG. 14 is a block diagram showing the configuration of a communication apparatus according to a third embodiment of the invention.

FIG. 14 is a block diagram showing the configuration of a communication apparatus according to the third embodiment.

The communication apparatus has an antenna 51, a low noise amplifying circuit 52 constructing a front end circuit, an IF/RF circuit 53, a baseband circuit 54, and a sound processing circuit 55. The low noise amplifying circuit 52 has the above-described detector 24, DC/DC converter 25, power amplifiers 61 and 62, and a duplexer 63. The power amplifier 61 is constructed by a semiconductor chip having the amplifying transistor 21, transistor 22 for temperature compensation, resistor 23, amplifying transistor 41 at the front stage, choke coils 26, 27, and 42, and the like (refer to FIG. 12 or 13).

According to the invention, the detecting unit which detects the base input power or collector output power of the amplifying transistor and the voltage changing unit which changes the collector voltage of the amplifying transistor in proportion to the detected power are provided, and the resistor for the base bias of the amplifying transistor is connected to the voltage changing unit. Consequently, high efficiency can be obtained over a wide range of the RF output, and the base bias control terminal becomes unnecessary.

Although the invention has been described with respect to a specific embodiment for a complete and clear disclosure, the appended claims are not to be thus limited but are to be construed as embodying all modifications and alternative constructions that may occur to one skilled in the art which fairly fall within the basic teaching herein set forth.

What is claimed is:

1. A high frequency power amplifier comprising:
   a first heterojunction bipolar transistor, having an emitter connected to a ground side, which amplifies a power supplied to its base and outputs the amplified power from its collector;
   a first resistor connected between said base and said collector of said first heterojunction bipolar transistor;
   a detecting unit which detects the power supplied to said base or the power output from said collector of said first heterojunction bipolar transistor; and
   a voltage changing unit which is connected to the collector of the first heterojunction bipolar transistor, and to the base of the first heterojunction transistor via the first resistor, and which changes a voltage to be supplied to said first heterojunction bipolar transistor in proportion to the power detected by said detecting unit,
   wherein the voltage changing unit supplies the voltage to the collector of the first heterojunction transistor as a collector voltage, and supplies the voltage via the first resistor to the base of the first heterojunction transistor as a base voltage.

2. The high frequency power amplifier according to claim 1 further comprising a second heterojunction bipolar transistor, having an emitter connected to the ground side and having a base and a collector which are connected to said base of said first heterojunction bipolar transistor.

3. The high frequency power amplifier according to claim 1, wherein when the collector output power of said first heterojunction bipolar transistor changes, said voltage changing unit changes the collector voltage of first heterojunction bipolar transistor in proportion to a change amount of a voltage drop of said first resistor.

4. The high frequency power amplifier according to claim 1, wherein when the collector output power of said first heterojunction bipolar transistor changes, said voltage changing unit changes the collector voltage of said first heterojunction bipolar transistor in proportion to a change amount in a sum of a voltage drop in said first and second resistors.

5. The high frequency power amplifier according to claim 1, wherein when the collector output power of said first heterojunction bipolar transistor changes, said voltage changing unit changes the collector voltage of said first heterojunction bipolar transistor so as to satisfy the condition that a base voltage of said first heterojunction bipolar transistor is equal to a voltage which becomes at an appropriate adjacent leakage power ratio when the collector output power of said first heterojunction bipolar transistor is the maximum.

6. The high frequency power amplifier according to claim 1, wherein when a collector output power of said first heterojunction bipolar transistor is smaller than its maximum value, said voltage changing unit changes the collector voltage of said first heterojunction bipolar transistor so as to satisfy the condition that the base voltage of said first heterojunction bipolar transistor is lower than a voltage which becomes at an appropriate adjacent leakage power ratio when the collector output power of said first heterojunction bipolar transistor is the maximum.

7. The high frequency power amplifier according to claim 1, wherein when the collector output of said first heterojunction bipolar transistor changes, said voltage changing unit changes the collector voltage of said first heterojunction bipolar transistor in such a manner that power gain of said first heterojunction bipolar transistor becomes constant.

8. The high frequency power amplifier according to claim 1, wherein said first resistor also serves as a negative feedback resistor for feeding back the collector voltage of said first heterojunction bipolar transistor to said base of said first heterojunction bipolar transistor.

9. The high frequency power amplifier according to claim 1, wherein said first resistor is a thermistor.

10. The high frequency power amplifier according to claim 1, wherein said first resistor is constructed by a base layer of a heterojunction bipolar transistor.

11. The high frequency power amplifier according to claim 2, further comprising a third heterojunction bipolar transistor, having an emitter connected to the ground side, which amplifies a power supplied to its base, outputs the amplified power from its collector, and supplies the power output from said collector to said base of said first heterojunction bipolar transistor,
    wherein a base bias voltage of said third heterojunction bipolar transistor is supplied via said first resistor.

12. The high frequency power amplifier according to claim 2, further comprising a third heterojunction bipolar transistor, having an emitter connected to the ground side, for amplifying a power supplied to its base, outputting the amplified power to its collector, and supplying the collector output power to the base of first heterojunction bipolar transistor,
    wherein a base bias voltage of said third heterojunction bipolar transistor at the front stage is supplied from a division point at which said first resistor is divided.

13. The high frequency power amplifier according to claim 11, wherein said first, second, and third heterojunction bipolar transistors, and said first resistor are formed on the same semiconductor.

14. The high frequency power amplifier according to claim 12, wherein said first, second, and third heterojunction bipolar transistors, and said first resistor are formed on the same semiconductor.

15. A communication apparatus comprising an RF front end circuit comprising:
    a semiconductor device having,
        a first heterojunction bipolar transistor, having an emitter connected to the ground side, which amplifies a power supplied to its base and outputs the amplified power from its collector;

a second heterojunction bipolar transistor, having an emitter connected to the ground side and having a base and a collector which are connected to said base of said first heterojunction bipolar transistor;

a third heterojunction bipolar transistor, having an emitter connected to the ground side, which amplifies a power supplied to its base, outputs the amplified power from its collector, and supplies the power output from said collector to said base of said first heterojunction bipolar transistor; and a resistor connected between said base and said collector of said first heterojunction bipolar transistor, which resistor supplies bias voltage to said base of said third heterojunction bipolar transistor, being formed on the same semiconductor; and a detecting unit which detects the power supplied to the said base or the power output from said collector of said first heterojunction bipolar transistor; and a voltage changing unit which changes a collector voltage of said first heterojunction bipolar transistor in proportion to a power detected by said detecting unit.

16. The communication apparatus according to claim 15, said semiconductor device further having a second resistor connected between said first resistor and said base of said first heterojunction bipolar transistor formed on the same semiconductor.

* * * * *